(12) United States Patent
in 't Zandt et al.

(10) Patent No.: US 8,766,380 B2
(45) Date of Patent: Jul. 1, 2014

(54) MEMS DEVICE FORMING METHOD AND DEVICE WITH MEMS STRUCTURE

(75) Inventors: Michael Antoine Armand in 't Zandt, Veldhoven (NL); Wim van den Einden, Deurne (NL); Harold Roosen, Eindhoven (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/325,320

(22) Filed: Dec. 14, 2011

(65) Prior Publication Data

US 2012/0153408 A1 Jun. 21, 2012

(30) Foreign Application Priority Data

Dec. 16, 2010 (EP) ................................. 10195471

(51) Int. Cl.
*H01L 27/14* (2006.01)

(52) U.S. Cl.
USPC .............. 257/414; 257/415; 257/433; 438/48

(58) Field of Classification Search
CPC ................... B81C 2201/0105; B81C 1/00476; B81C 1/0023
USPC .............. 257/415, 433, 414; 438/48
See application file for complete search history.

(56) References Cited

U.S. PATENT DOCUMENTS

| | | | |
|---|---|---|---|
| 4,717,681 A * | 1/1988 | Curran | 438/314 |
| 6,306,422 B1 * | 10/2001 | Batich et al. | 424/423 |
| 7,416,281 B2 | 8/2008 | Nishimura et al. | |
| 2008/0145976 A1 * | 6/2008 | O'Mahony et al. | 438/126 |
| 2009/0194309 A1 | 8/2009 | Gillot et al. | |
| 2011/0175178 A1 | 7/2011 | van Wingerden et al. | |

FOREIGN PATENT DOCUMENTS

| | | |
|---|---|---|
| CN | 1681658 A | 10/2005 |
| EP | 2 402 284 A1 | 1/2012 |
| GB | 2 373 367 A | 9/2002 |

OTHER PUBLICATIONS

He, R. et al. "On-Wafer Monolithic Encapsulation by Surface Micromachining with Porous Polysilicon Shell", IEEE J. of Microelectromechanical Systems, vol. 16, No. 2, pp. 462-472 (2007).
Verheijden, G. J. A. M. et al. "Wafer Level Encapsulation Technology for MEMS Devices Using an HF-Permeable PECVD SIOC Capping Layer", IEEE, $21^{st}$ Int'l. Conf. on Micro Electro. Mechanical Systems, pp. 798-801 (2008).
Extended European Search Report for EP Patent Appln. No. 10195471.7 (Jun. 24, 2011).
Office Action from counterpart application CN201110041508.2 (Mar. 11, 2014).

* cited by examiner

*Primary Examiner* — Kyoung Lee
*Assistant Examiner* — Ratisha Mehta (57) ABSTRACT

A method of forming a MEMS device by encapsulating a MEMS element with a sacrificial layer portion deposited over a substrate arrangement, the portion defining a cavity for the MEMS element, forming at least one strip of a further sacrificial material extending outwardly from the portion, forming a cover layer portion over the sacrificial layer portion, the cover layer portion terminating on the at least one strip, removing the sacrificial layer portion and the at least one strip, the removal of the at least one strip defining at least one vent channel extending laterally underneath the cover layer portion and sealing the at least one vent channel. A device including such a packaged micro electro-mechanical structure.

8 Claims, 7 Drawing Sheets

Figure 1:
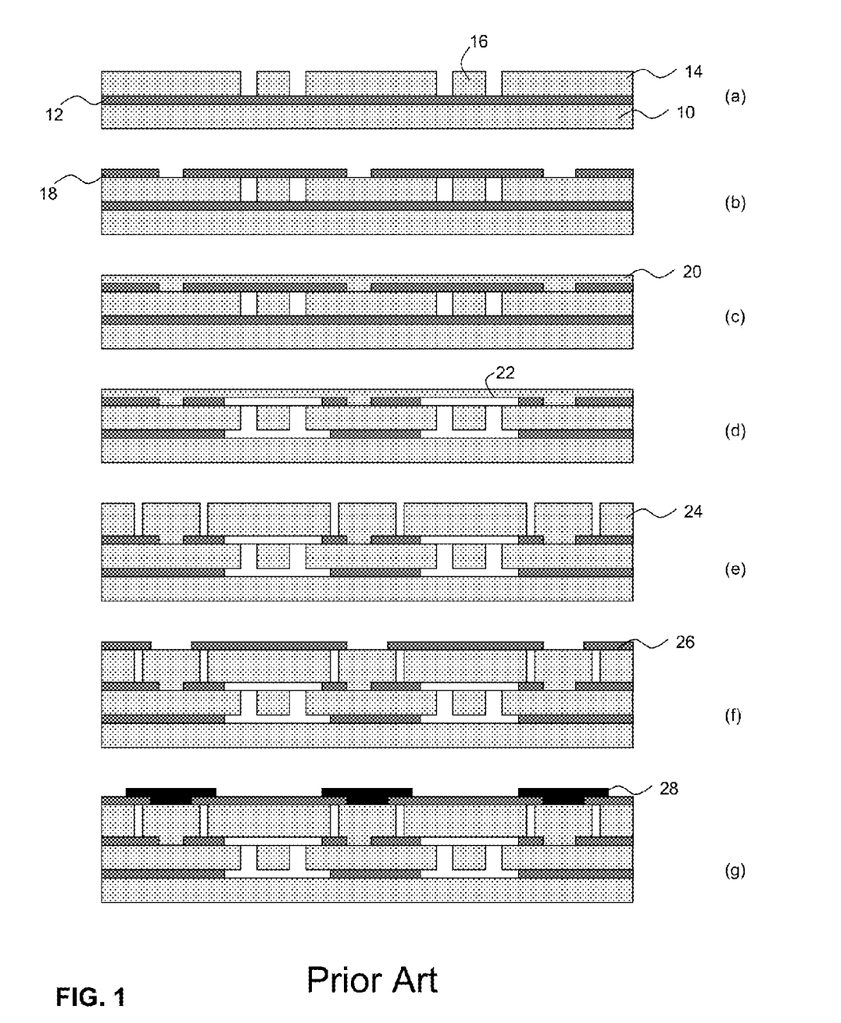

FIG. 2q ately 2 micron) layer 20 of silicon is deposited over the substrate stack in which micron-scale vent channels (not shown) are etched to allow HF vapor access for release of the resonant structures 16 in step (d), in which the cavities 22 each including a resonant structure 16 are formed. In step (e), a silicon encapsulation layer 24 is deposited at 950° C. followed by a CMP planarization and etching of the encapsulation layer 24 to define the electrical contacts. In step (f), oxide 26 is deposited to seal the trenches and is etched to allow the electrical contact to the underlying encapsulation layer 24, after which aluminum contacts 28 are formed in step (g) by deposition and etching.

This process flow has several drawbacks. For instance, the etching of the micrometer sized vent channels requires an additional processing step, thus adding to the cost of the overall manufacturing process. Also, to avoid contamination of the cavity containing the MEMS structure with capping material, the vent channels should not be located directly over the cavity, thus limiting the flexibility of the manufacturing process. Moreover, relatively thick capping layers are required to effectively seal the cavity, thus further adding to the cost of the manufacturing process.

In the paper "Wafer Level Encapsulation Technology for MEMS Devices using a HF-Permeable PECVD SIOC Capping Layer" by G. J. A. M. Verheijden et al. in MEMS 2008, IEEE 21$^{st}$ conference on Micro Electro Mechanical Systems 2008, pages 798-801, an alternative technology for the encapsulation of MEMS devices using a porous capping material is disclosed, which overcomes many of the problems associated with the process of FIG. 1.

The capping material consists of a low temperature PECVD layer of SiOC (trade name Black Diamond) and is shown to be permeable to HF vapor and $H_2O$ and therefore allows for the removal of a $SiO_2$ sacrificial layer and the formation of a cavity underneath the capping layer, with the capping material being permeable enough to allow for the evacuation of the $SiO_2$ reaction products. The cavity underneath the capping layer allows for high-Q operation of a MEMS resonator. A sealing layer can be deposited on the capping layer without significantly contaminating the cavity. However, it has been found that residual contamination of the cavity is difficult to avoid, especially when a sealing layer consisting of relatively small molecules is formed. In addition, there are no suitable process steps available to seal the porous layer at high temperature and low pressure, such that it is difficult to obtain a cavity with a high quality vacuum using this method.

In R. He et al., Journal of Micro-electromechanical Systems, Vol. 16, pages 462-472 (2007), a porous polysilicon cap layer is obtained over a MEMS structure by electrochemical etching of a polysilicon layer. Sealing of this layer is performed with the deposition of a further polysilicon layer or an LPCVD silicon oxide layer. The drawback of this approach is that the electrochemical etching of the polysilicon layer to obtain the porous polysilicon cannot be readily achieved in standard manufacturing tools, thus requiring an additional investment. In addition, the packaging method proposed in this paper requires the inclusion of a critical point drying step after the cavity formation for avoiding the MEMS structures sticking to the cavity walls. Furthermore, the required background pressures of the proposed sealing techniques are such that the preferable low pressure in the packaged cavity cannot be achieved.

SUMMARY OF THE INVENTION

The present invention seeks to provide a cost-effective method of packaging a MEMS structure, preferably in a low pressure cavity on a substrate.

The present invention further seeks to provide a device comprising such a packaged MEMS structure.

In accordance with a first aspect of the present invention, there is provided a forming a MEMS device, comprising encapsulating a MEMS element with a sacrificial layer portion deposited over a substrate arrangement, said portion defining a cavity for the MEMS element; forming at least one strip of a further sacrificial material extending outwardly from said portion; forming a cover layer portion over the sacrificial layer portion, said cover layer portion terminating on the at least one strip; removing the sacrificial layer portion and the at least one strip, the removal of the at least one strip defining at least one vent channel extending laterally underneath the cover layer portion; and sealing the at least one vent channel.

The present invention has been based on the insight that lateral vent channels can be formed that extend from the cavity to be formed in a lateral direction underneath the cover of the cavity, such that upon sealing of the vent channels, contamination of the cavity can be avoided. The channels are preferably kept very small, i.e. by providing one or more strips with a thickness in the range of 5-50 nm to prevent significant contamination of the cavity and to allow for the vent channels to be effectively sealed in the sealing step.

It is noted that the above embodiment of the present invention is particularly suitable for the formation of relatively small cavities. For larger cavities, if the sacrificial materials are to be removed by etching, e.g. a hydrogen fluoride (HF) etch, the etch duration required to fully remove the sacrificial layer portion can cause damage to other parts of the device.

For larger cavities, it is advantageous to convert the cover layer portion into a porous cover layer portion by chemical treatment of the cover layer portion, said chemical treatment simultaneously removing the sacrificial layer portion and the at least one strip such that the removal of the sacrificial layer portion can mainly take place through the porous cover layer portion, thereby reducing the time it takes to form the cavity, such that other components of the device are less likely to be damaged during the removal of the sacrificial layer portion.

It may appear that when a material is used that can be converted into a porous material by such chemical treatment the presence of the vent channels becomes superfluous. However, it has been surprisingly found by the present invention that this is not the case. This is because the material made porous by the chemical treatment can become very reactive, such that upon completion of the chemical treatment the porous material immediately seals again by reaction with ambient reactants such as water and air, which can cause residual gases to become trapped inside the cavity, which makes it difficult to set the pressure inside the cavity to the desired value. The presence of the vent channels ensures that such residual gases can still escape from the cavity upon completion of the chemical treatment step.

In a preferred embodiment, the cover layer portion comprises SIPOS (semi-insulating polycrystalline silicon), and wherein said chemical treatment step comprises treating the SIPOS with a hydrogen fluoride (HF) etch recipe, as SIPOS may be temporarily made porous by treatment with HF, which furthermore is a suitable etchant for removing sacrificial materials such as silicon oxide ($SiO_2$) and TEOS (tetraethyl-orthosilicate).

In an embodiment, the method further comprises forming a patterned support layer over the sacrificial layer portion, said patterned support layer defining etching holes on top of the sacrificial layer portion, wherein the step of forming the cover layer portion comprises forming the cover layer portion over the sacrificial layer portion including the patterned support layer, and wherein the cover layer portion is separated from the at least one strip by a portion of the patterned support layer. This has the advantage of improving the structural integrity of the cavity as well as defining etch holes on top of the sacrificial layer portion and defining the length of the vent channels to be formed. The support layer preferably is a polysilicon layer.

In an embodiment, the sealing step comprises depositing a capping layer over the resultant structure, which may be performed at a vacuum pressure, e.g. in the range of $10^{-4}$-$10^{-6}$ Torr to ensure that the pressure inside the cavity is set to the desired (near-)vacuum pressure.

In accordance with another aspect of the present invention, there is provided a device comprising a substrate covered by a cover layer portion, a cavity in between the substrate and the cover layer portion, said cavity including a micro electromechanical structure; at least one vent channel underneath the cover layer portion, said at least one vent channel extending laterally from said cavity; and a sealing layer covering the cover layer portion and sealing the at least one vent channel. Such a device is the resulting product of the method of the present invention and therefore benefits from a MEMS device in a cavity that is substantially free from contamination and which has a well-defined internal pressure.

In a preferred embodiment, the cover layer portion comprises hydrogen fluoride-treated SIPOS. The HF-treated SIPOS enables the formation of a device having a relatively large cavity as previously explained as during the HF treatment the SIPOS becomes porous and facilitates the removal of the sacrificial material defining the cavity without causing damage to other parts of the device.

In a preferred embodiment, the device comprises a patterned support structure covered by the cover layer portion to improve the structural integrity of the cavity.

BRIEF DESCRIPTION OF THE DRAWINGS

Embodiments of the invention are described in more detail and by way of non-limiting examples with reference to the accompanying drawings, wherein:

FIGS. 1a-g depict a known method of manufacturing a MEMS device; and

FIGS. 2a-q depict a method of manufacturing a MEMS device in accordance with an exemplary embodiment of the present invention.

It should be understood that the Figures are merely schematic and are not drawn to scale. It should also be understood that the same reference numerals are used throughout the Figures to indicate the same or similar parts.

DETAILED DESCRIPTION OF EMBODIMENTS

A first embodiment of a packaging method of the present invention is described in more detail with the aid of FIG. 2. In FIG. 2a, a substrate 100, which may be any suitable substrate, e.g. a silicon substrate, a silicon-on-insulator (SOI) substrate, a SiGe substrate and so on, is provided with a first layer 110 of a sacrificial material, onto which a layer of a suitable material 120, e.g. silicon, is deposited and subsequently patterned, e.g. by means of wet chemical etching or reactive ion etching (RIE) to form the outline of MEMS structure 122, such as a MEMS resonator or another suitable MEMS device as shown in FIG. 2b. The patterning step should be selective to the underlying sacrificial layer 110 if present. Such processing steps are well-known to the skilled person and will not be explained in further detail for reasons of brevity only. Any suitable sacrificial material may be used. Non-limiting examples of suitable sacrificial materials include TEOS (tetraethyl-orthosilicate) and $SiO_2$, e.g. a LPCVD (low-pressure chemical vapor deposition) silicon dioxide. In an alternative embodiment, the sacrificial material layer 110 may be omitted in case the MEMS device 122 is to be anchored on the substrate 100. After patterning of layer 120 to form the MEMS device 122, ion implantations into the layer 120 may be performed if necessary.

Figure 2A:
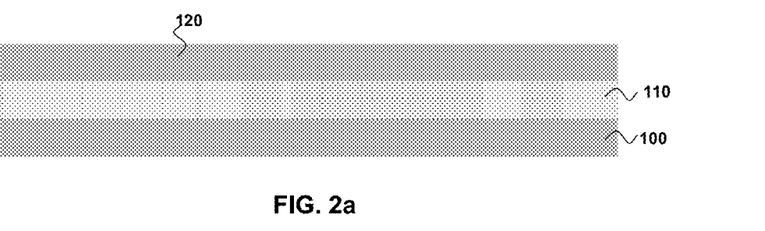
Figure 2B:
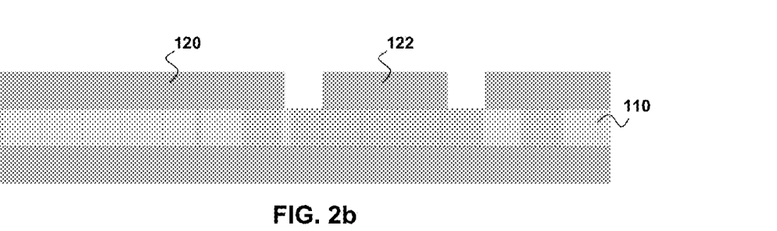
Figure 2C:
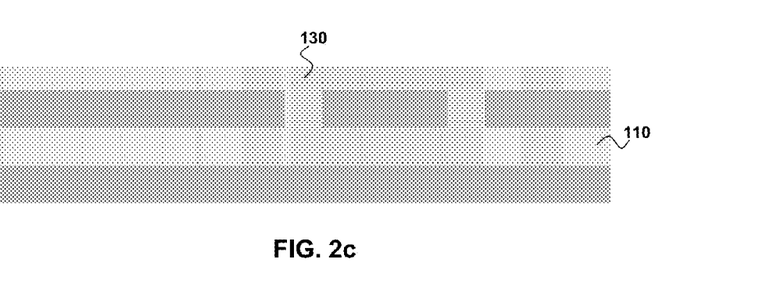

In FIG. 2c, a layer 130 of a further sacrificial material is deposited over the patterned material layer 120 such that the MEMS device 122 is fully covered by the sacrificial material in the cross-section of the device shown in FIG. 2. In a preferred embodiment, the sacrificial layer 130 is of a material that can be removed in the same process step as the removal of the material of the optional sacrificial layer 110. For instance, the material of the sacrificial layer 130 may be the same as the material of the sacrificial layer 110.

Figure 2D:
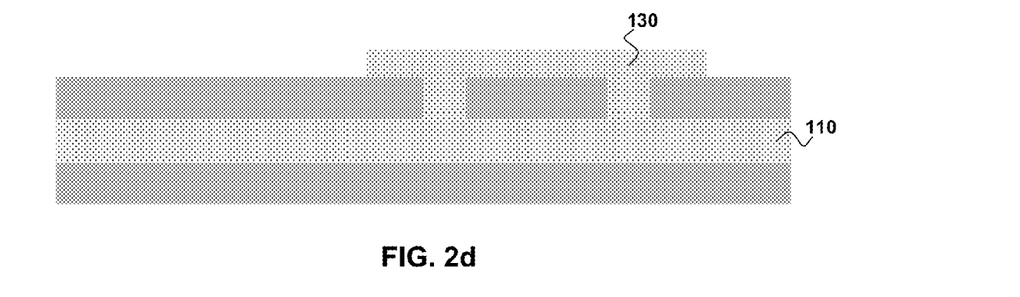

In FIG. 2d, the further sacrificial layer 130 is patterned in any suitable manner, e.g. by photolithography and subsequent etching, such as wet chemical etching or RIE, thereby forming a portion of the sacrificial layer 130 that covers the MEMS device 122 and defines at least part of the cavity to be formed around the MEMS device 122. The remainder of the cavity to be formed may be defined by a portion of the sacrificial layer 110. The patterning of the further sacrificial layer 130 preferably is performed by an etching step that is selective to the underlying layer 120, e.g. a silicon layer.

Figure 2E:
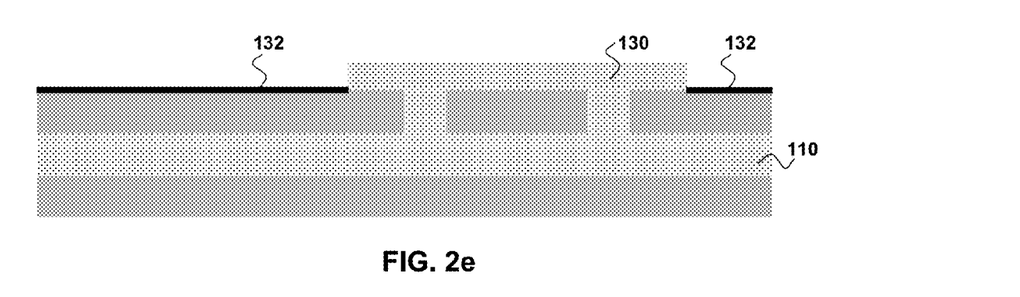

The method proceeds as shown in FIG. 2e with the growth or deposition of a second further sacrificial layer 132, e.g. a TEOS or $SiO_2$ layer over the resultant structure. The second further sacrificial layer 132 is preferably much thinner than the further sacrificial layer 130, e.g. in the range of 5-50 nm compared to a typical thickness of the further sacrificial layer 130 in the micrometer domain. The further sacrificial layer 130 preferably has a thickness ranging from a few hundred nanometer to several micrometer as it has been found that a further sacrificial layer 130 having a thickness in this range is sufficiently thick to prevent sticking of the cap layer 135 to the MEMS device 122 during its release, whilst being thin enough to avoid complications in the further processing of the MEMS device 122.

Figure 2F:
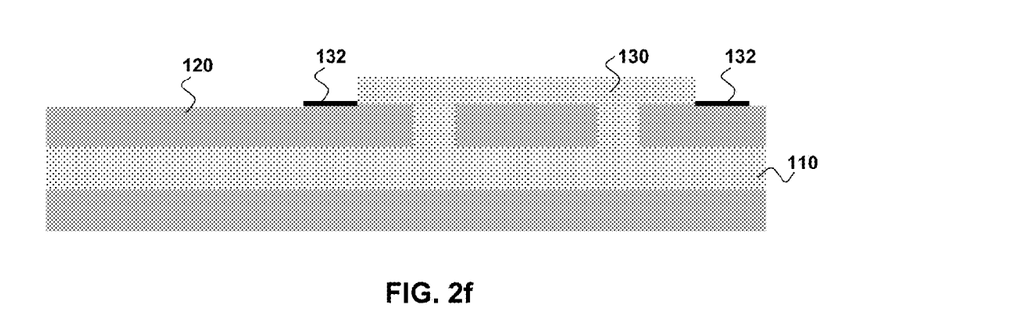
Figure 2G:
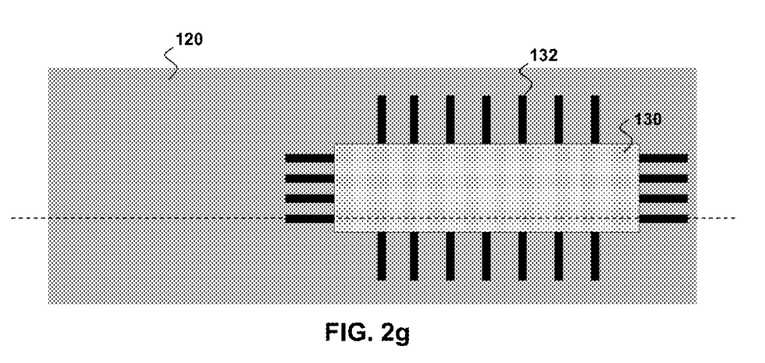

The second further sacrificial layer 132 is subsequently patterned as shown in FIG. 2f in any suitable manner, e.g. using photolithography followed by an etching step such as a wet chemical etching step or a RIE step to form at least one strip of the second further sacrificial layer 132 that lies against the portion of the further sacrificial layer 130 covering the MEMS device 122, with one or more strips of the second further sacrificial layer 132 extending laterally from this portion. A top view of this structure is shown in FIG. 2g. The strips 132 will act as vent channels for the degassing of the cavity of the MEMS device 122 as will be explained in more detail later. The number of strips 132 may be determined by the desired degassing rate, with higher rates requiring more strips 132. However, it should be understood that in principle a single strip 132 may suffice, in particular when the volume of the cavity to be formed is relatively small.

Figure 2H:
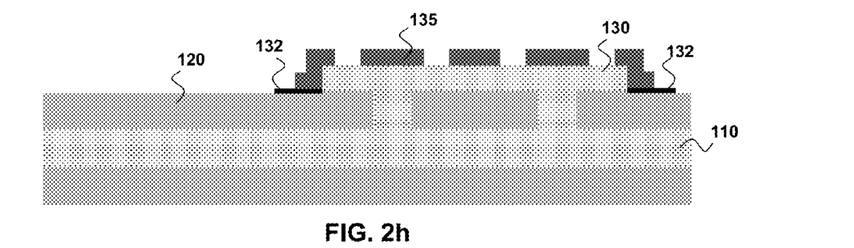
Figure 2I:
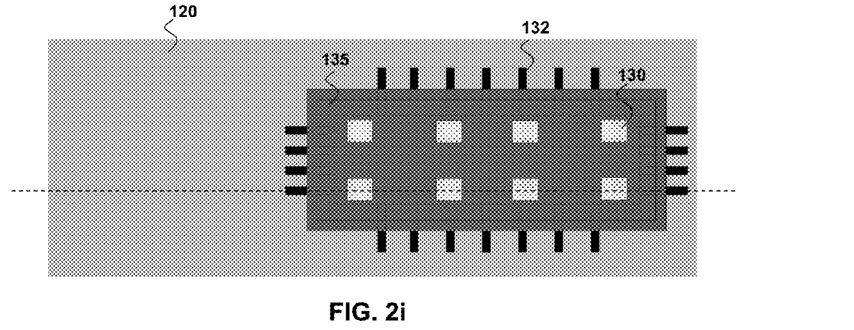

The method may proceed as shown in FIG. 2h with the deposition and subsequent patterning of a support layer 135, which is intended to strengthen the lid of the cavity to be formed against collapsing. Any suitable material may be used for the support layer 135, such as polycrystalline silicon (poly-Si). The patterning of the support layer 135 may be achieved in any suitable manner, e.g. by etching, which etching step should be selective to the underlying further sacrificial layer 130 and the second further sacrificial layer 132. The patterning of the support layer 135 may optionally include the formation of etch holes on top of the portion of the underlying further sacrificial layer 130 covering the MEMS device 122. This optional embodiment is for instance useful if a cover layer to be formed is to be made porous to assist the degassing of the cavity to be formed, as will be explained in more detail later. A top view of the resultant structure after the patterning of the support layer 135 is shown in FIG. 2i, which includes the etch holes exposing the underlying portion of the further sacrificial layer 130.

Figure 2J:
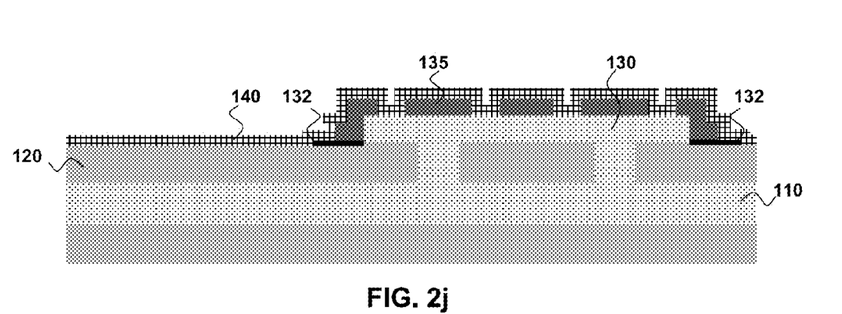

It is noted that in an alternative embodiment, the formation of the support layer 135 is omitted from the method of the present invention, such that the method proceeds from the step shown in FIG. 2f directly to the step shown in FIG. 2j. The presence of the support layer 135 is however preferred as it strengthens the cavity of the MEMS device 122 as previously explained.

Figure 2K:
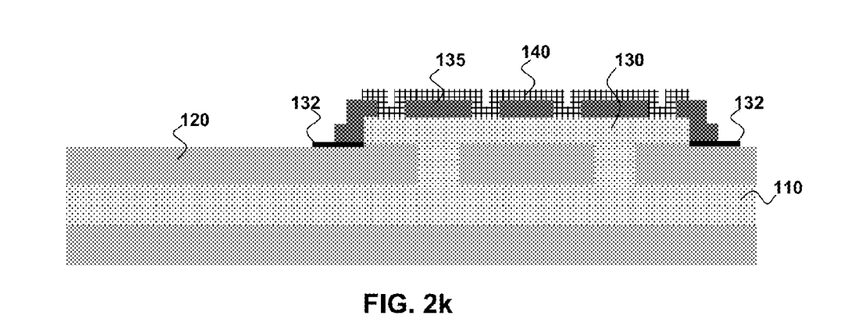
Figure 2L:
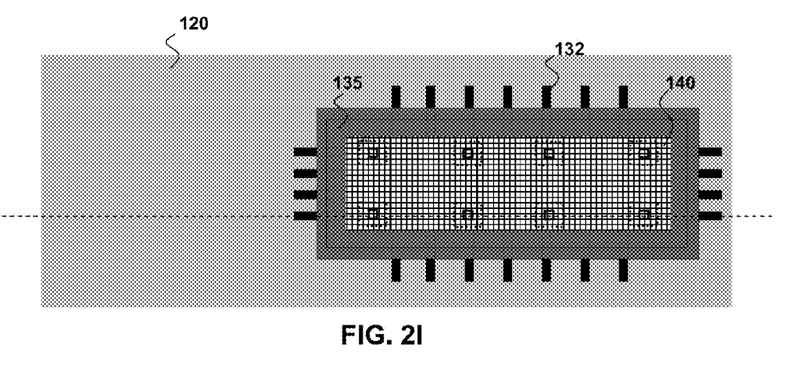

The method proceeds as shown in FIG. 2j, in which a cover layer 140 is formed over the resultant structure. The cover layer 140 is subsequently patterned as shown in FIG. 2k, such that the cover layer 140 covers the portion of the further sacrificial layer 130 that covers the MEMS device 122 and the patterned support layer 135 if present. In addition, the patterning of the cover layer 140 ensures that the end portions of the strips 132 are exposed, i.e. that the cover layer 140 terminates on the strips 132. In case of the presence of the patterned support layer 135, a portion of the patterned cover layer 140 over a strip 132 may be separated from the strip 132 by a portion of the patterned support layer 135. A top view of the resulting structure is shown in FIG. 2l.

The cover layer 140 may be a permanently non-porous layer, in which case the subsequent removal of the sacrificial materials, e.g. materials 110, 130 and 132 is to be achieved through vent channels to be formed by the removal of the strips 132. This may be a feasible embodiment if the cavity to be formed is small enough such that the complete removal of the respective sacrificial materials may be achieved quickly enough such that other parts of the device are not damaged by the chemicals used for the removal of these sacrificial materials.

In a preferred embodiment, the cover layer 140 comprises a material that can be made porous by chemical treatment such that the removal of the sacrificial materials for defining the MEMS cavity and the vent channels can also take place through the pores of the material of the cover layer 140. A preferred embodiment of such a material is SIPOS, which is an oxide-rich poly-Si, which may be formed by the co-deposition of $SiO_2$ and silicon or by depositing poly-Si in a (slightly) oxidizing atmosphere. The SIPOS layer 140 may be patterned in any suitable manner, e.g. by means of a wet chemical etch or by means of a RIE step.

Figure 2M:
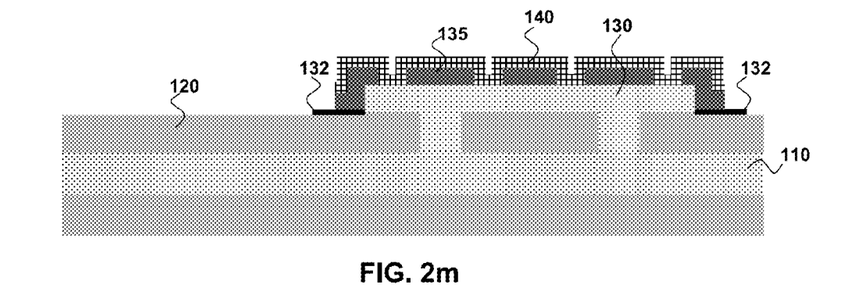

FIG. 2m shows an alternative embodiment of FIG. 2k, in which the cover layer 140 is patterned simultaneously with the support layer 135, i.e. both layers are patterned by a single patterning step such as a wet chemical etch or a RIE step. This leads to a subsequently vertical structure on the one or more strips 132, said vertical structure formed by a portion of the patterned support layer 135 and a portion of the cover layer 140. In this embodiment, if the support layer 135 should further comprise etch windows on top of the portion of the further sacrificial layer 130 that covers the MEMS device 122, these etch windows should be formed prior to the deposition of the cover layer 140.

Figure 2N:
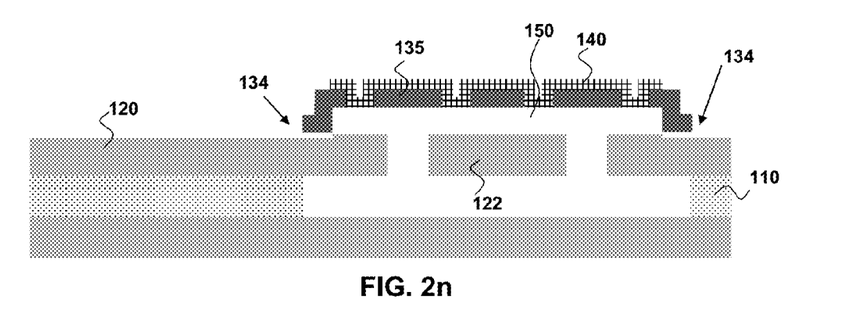

The method subsequently proceeds from the resultant structure shown in FIG. 2k or from the resultant structure shown in FIG. 2m as shown in FIG. 2n, in which the MEMS device 122 is released from the substrate 100 by the simultaneous removal of the sacrificial materials, e.g. a portion of the sacrificial layer 110 if present, the portion of the further sacrificial layer 130 and the one or more strips formed by the patterning of the second further sacrificial layer 132, thereby forming a cavity 150. As previously mentioned, in a preferred embodiment, the cover layer 140 is a SIPOS layer, in which case the removal of the sacrificial materials is performed by HF etching, which simultaneously removes an $SiO_x$ component ($0<x\le 2$) from the SIPOS cover layer 140, thereby rendering the SIPOS cover layer 140 porous, such that the removal of the sacrificial materials is mainly achieved through the porous SIPOS cover layer 140. The exposure to the etch recipe, e.g. the HF etch recipe should be long enough to ensure that the strips 132 are fully removed, thereby forming the vent channels 134 laterally extending from the cavity 150 to the outside world. The vent channels 134 are formed between the material layer 120 and a portion of cover layer 140 or a portion of the support layer 135 if present. The height of the vent channels 134, i.e. the distance between the material layer 120 and the opposite portion of cover layer 140 or the portion of the support layer 135 if present preferably lies in the range of 5-50 nm. Below 5 nm degassing through the vent channels 134 becomes cumbersome, and above 50 nm the subsequent sealing of the vent channels 134 becomes cumbersome.

Figure 2O:
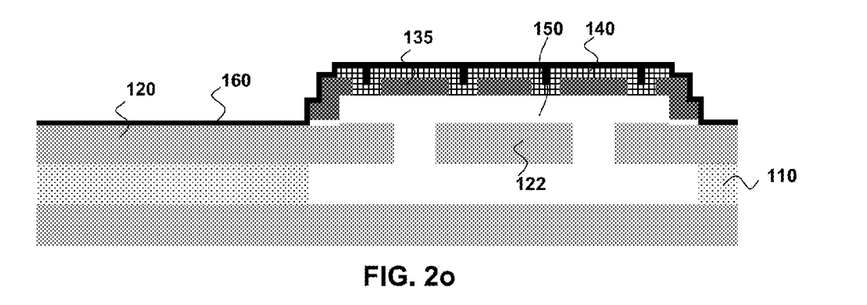

Following the termination of the etch step, the porous SIPOS cover layer 140 will rapidly react with ambient reactants, e.g. water or air, which will effectively seal the SIPOS layer 140. The method next proceeds to step 2o, in which a sealing or capping layer 160 is deposited over the resultant structure to seal the cover layer 140 if necessary but more importantly to seal the vent channels 134. The sealing layer 160 preferably is an electrically insulating layer. Suitable materials for the sealing layer 160 include $SiO_x$ ($0<x\leq2$) and $Al_2O_3$. The sealing layer 160 may be deposited in any suitable manner, e.g. by physical vapor deposition. In a preferred embodiment, the deposition is performed at a near-vacuum pressure, e.g. a pressure in the range of $10^{-4}$-$10^{-6}$ Torr (mm Hg). This ensures that the pressure in the cavity 150 is set to the operating pressure of the deposition process, as any overpressure in the cavity 150 can escape through the one or more vent channels 134 prior to the effective sealing of these channels. Upon sealing of the vent channels 134, the cavity 150 has become hermetically sealed.

Figure 2P:
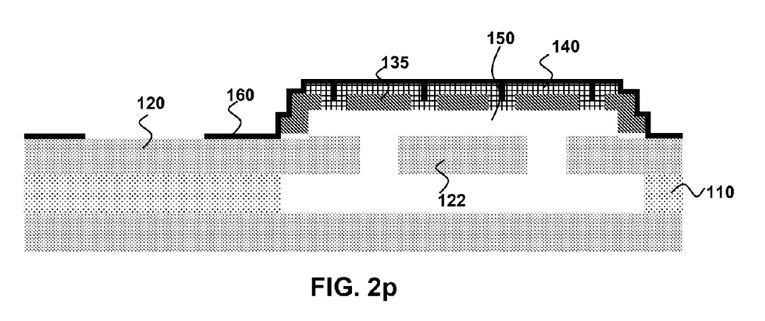
Figure 2Q:
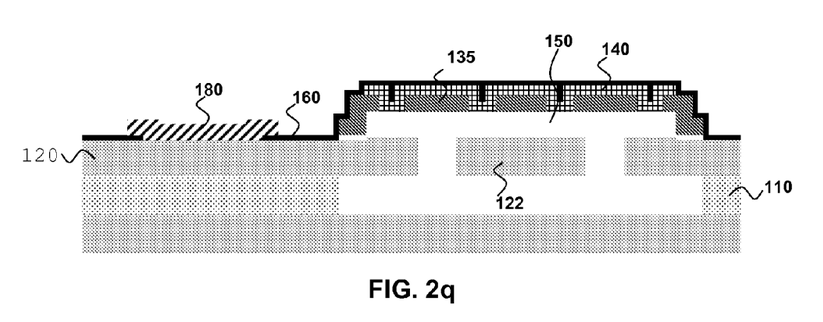

The method may further include post-packaging processing steps, such as the formation, e.g. etching, of a contact region for the MEMS structure 122 through the sealing layer 160 to the underlying material layer 120, as shown in FIG. 2p, after which a conductive contact 180 may be formed in the contact region as shown in FIG. 2q. The conductive contact 180 may be a metal contact, e.g. an Al contact, and may be formed in any suitable manner, e.g. by depositing a metal layer over the resultant structure of FIG. 2p and patterning this layer to form the metal contact. Alternatively, a selective deposition process may be used.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A device comprising:
a substrate covered by a cover layer portion,
a cavity between the substrate and the cover layer portion, said cavity including a micro electro-mechanical structure;
wherein the cover layer includes a patterned support structure layer having an etching hole disposed above the cavity;
at least one vent channel underneath the cover layer portion, said at least one vent channel extending laterally from said cavity; and
a sealing layer covering the cover layer portion and sealing the at least one vent channel and the etching hole above the cavity.

2. The device of claim 1, wherein the cover layer portion comprises hydrogen fluoride-treated SIPOS.

3. The device of claim 1, wherein the patterned support structure is covered by the cover layer portion.

4. The device of claim 1, wherein the at least one vent channel has a height in the range of 5-50 nm.

5. The device of claim 1, wherein the device further comprises a plurality of said vent channels.

6. The device of claim 1, wherein the cover layer includes a porous layer filling in the etching hole above the cavity.

7. The device of claim 6, wherein the porous layer consists of a semi-insulating polycrystalline silicon (SIPOS) layer.

8. The device of claim 1, wherein the patterned support structure layer includes a plurality of etching holes distributed above the cavity.

\* \* \* \* \*